(12) United States Patent
McIntyre et al.

(10) Patent No.: US 10,212,804 B2
(45) Date of Patent: Feb. 19, 2019

(54) ELECTRONIC DEVICE WITH LATERALLY EXTENDING THERMALLY CONDUCTIVE BODY AND RELATED METHODS

(71) Applicant: HARRIS CORPORATION, Melbourne, FL (US)

(72) Inventors: John R. McIntyre, Rochester, NY (US); Kevin Dell, Fairport, NY (US); Timothy W. Burks, Huntsville, AL (US)

(73) Assignee: HARRIS GLOBAL COMMUNICATIONS, INC., Albany, NY (US)

( * ) Notice: Subject to any disclaimer, the term of this patent is extended or adjusted under 35 U.S.C. 154(b) by 72 days.

(21) Appl. No.: 15/407,012

(22) Filed: Jan. 16, 2017

(65) Prior Publication Data

US 2018/0206325 A1 Jul. 19, 2018

(51) Int. Cl.
*H05K 1/02* (2006.01)
*H05K 7/20* (2006.01)

(52) U.S. Cl.
CPC ............ *H05K 1/0209* (2013.01); *H05K 7/205* (2013.01); *H05K 1/0224* (2013.01); *H05K 2201/0715* (2013.01); *H05K 2201/10416* (2013.01)

(58) Field of Classification Search
CPC .... H05K 1/0209; H05K 7/205; H05K 1/0224; H05K 2201/0715; H05K 2201/10416; H05K 1/02

USPC ......................................................... 174/252
See application file for complete search history.

(56) References Cited

U.S. PATENT DOCUMENTS

| | | | |
|---|---|---|---|
| 4,001,711 A | 1/1977 | Knutson et al. | |
| 4,237,521 A | 12/1980 | Denker | |
| 5,216,580 A | 6/1993 | Davidson | |
| 5,311,395 A | 5/1994 | McGaha et al. | |
| 5,371,404 A | 12/1994 | Juskey et al. | |
| 6,156,980 A | 12/2000 | Peugh et al. | |
| 6,296,048 B1 | 10/2001 | Sauer | |
| 6,977,440 B2 | 12/2005 | Pflughaupt et al. | |
| 7,342,788 B2 | 3/2008 | Nikfar | |
| 2005/0046001 A1 | 3/2005 | Warner | |
| 2006/0012016 A1 | 1/2006 | Betz et al. | |
| 2012/0280374 A1* | 11/2012 | Choi | H01L 21/50 257/659 |

* cited by examiner

*Primary Examiner* — Tremesha S Willis
(74) *Attorney, Agent, or Firm* — Allen, Dyer, Doppelt + Gilchrist, P.A.

(57) ABSTRACT

An electronic device may include a circuit board, an IC carried by the circuit board, and an RF shield above the IC. The circuit board may include a dielectric layer, and a thermally conductive body in the dielectric layer. The thermally conductive body may have a first heat transfer surface coupled to the IC. The thermally conductive body may extend laterally within the dielectric layer and outward past the RF shield and defining a second heat transfer surface. The electronic device may include a heat sink coupled to the second heat transfer surface.

16 Claims, 6 Drawing Sheets

ELECTRONIC DEVICE WITH LATERALLY EXTENDING THERMALLY CONDUCTIVE BODY AND RELATED METHODS

TECHNICAL FIELD

The present disclosure relates to the field of electronic devices, and, more particularly, to radio frequency devices and related methods.

BACKGROUND

Electronic devices are widely used in many types of electronic equipment. One electronic device is the integrated circuit (IC) which may include a silicon or gallium arsenide substrate and a number of active devices, such as transistors, etc. formed in an upper surface of the substrate. It is also typically required to support one or more such ICs in a package that provides protection and permits external electrical connection.

As the density of active devices on typical ICs has increased, dissipation of the heat generated has become increasingly more important. In particular, a relatively large amount of heat may be generated in multi-chip modules (MCMs), microwave transmitters, and photonic devices, for example.

One heat dissipation approach which has been used in a variety of applications, including electronic circuit modules, to provide high thermal transport over long distances is a "heat pipe." The heat pipe is a sealed system that includes an evaporator, a condenser, an adiabatic region connecting the evaporator and condenser for liquid and vapor transport, and a capillary or wick for circulating cooling fluid therein. Heat pipes enjoy an advantage over other forms of heat regulating devices in that they can transfer heat without the need for a mechanical pump, compressor or electronic controls, which may provide space savings in certain instances.

An example of an MCM which uses a heat pipe is disclosed in U.S. Pat. No. 5,216,580 to Davidson et al. This MCM includes electronic circuit components mounted on one side thereof and a thermal wick mounted on another side. A heat pipe evaporator and condenser assembly is attached to the MCM and wick assembly. Furthermore, a suitable working fluid is introduced into the heat pipe assembly which is then hermetically sealed.

In some electronic device applications, the substrate may comprise plastic. In these applications, the heat dissipation approach may comprise the substrate with a copper body or "coin" directly beneath the IC and extending completely through the substrate. The copper coin transfers thermal energy from the IC through the substrate and out the opposite surface, i.e. out the exposed bottom of the copper coin.

Referring to FIG. 1, a prior art electronic device 400 includes a plastic substrate 401, and a thermally conductive copper coin 404 carried within the plastic substrate. The electronic device 400 includes first and second ICs 402a-402b carried by an upper surface of the plastic substrate 401, and a radio frequency (RF) shield 403 over the upper surface.

Referring to FIG. 2, another prior art electronic device 500 includes a plastic substrate having two stacked layers 501a-501b, and a thermally conductive copper coin 504 carried within the plastic substrate. In this approach, the thermally conductive copper coin 504 is press-fitted or embedded into the plastic substrate. The electronic device 500 includes an IC 502 carried by an upper surface of the plastic substrate.

SUMMARY

Generally speaking, an electronic device may comprise a circuit board, an IC carried by the circuit board, and an RF shield above the IC. The circuit board may comprise a dielectric layer, and a thermally conductive body in the dielectric layer. The thermally conductive body may have a first heat transfer surface coupled to the IC. The thermally conductive body may extend laterally within the dielectric layer and outward past the RF shield and define a second heat transfer surface. The electronic device may include a heat sink coupled to the second heat transfer surface. Advantageously, the electronic device may transfer thermal energy laterally and vertically upward away from the circuit board.

More specifically, the first and second heat transfer surfaces may be coplanar. The circuit board may include a top surface adjacent the IC, and a bottom surface opposite the top surface. In some embodiments, the electronic device may further comprise an additional IC carried by the bottom surface. Also, the thermally conductive body may extend only partially through the dielectric layer and may not be exposed on the bottom surface.

Additionally, the heat sink may comprise a base adjacent the second heat transfer surface, and an arm extending transversely to the base and over the RF shield. The thermally conductive body may have flanged peripheral edges. The thermally conductive body may be coupled to an electrical reference voltage for the IC, for example.

For example, the thermally conductive body may comprise copper. Also, in some embodiments, the circuit board may comprise a thermal dam adjacent the IC. The electronic device may also include a thermal adhesive layer between the second heat transfer surface and the heat sink.

Another aspect is directed to a method for making an electronic device. The method may include positioning an IC on a circuit board and beneath a RF shield. The circuit board may comprise a dielectric layer, and a thermally conductive body in the dielectric layer. The thermally conductive body may have a first heat transfer surface coupled to the IC. The thermally conductive body may extend laterally within the dielectric layer and outward past the RF shield and define a second heat transfer surface. The method may include coupling a heat sink to the second heat transfer surface.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 3:
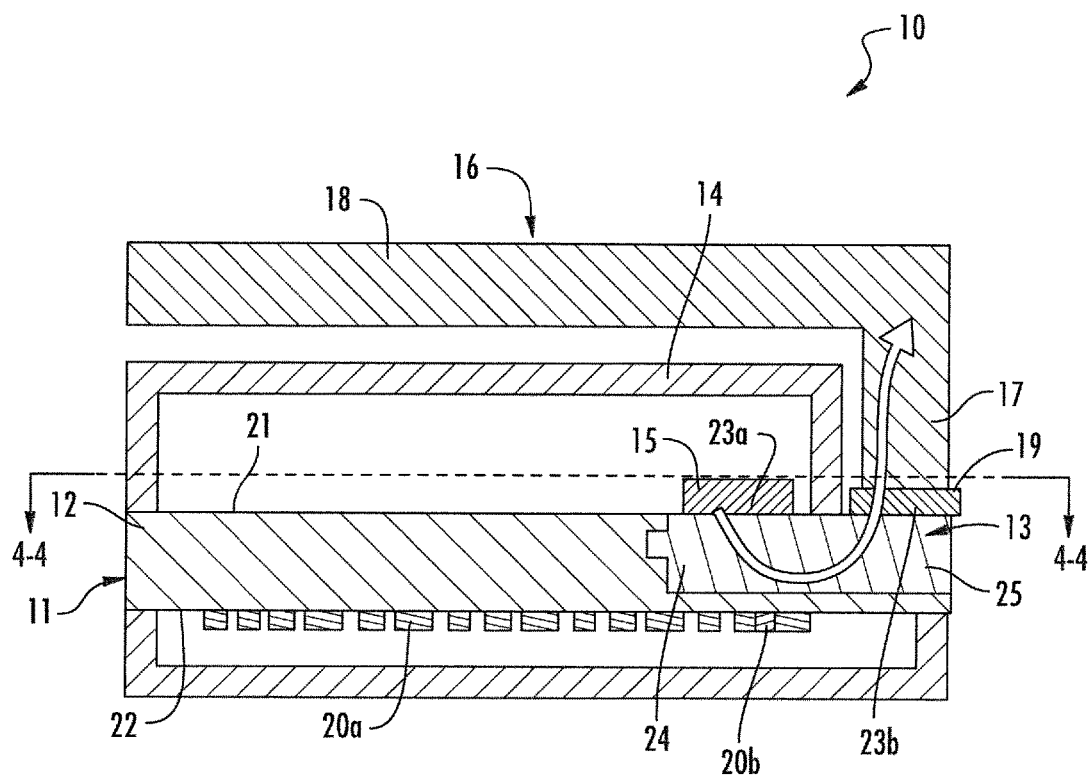
FIG. 3 is a schematic cross-sectional view of an electronic device along line 3-3 from FIG. 4, according to the present disclosure.
Figure 4:
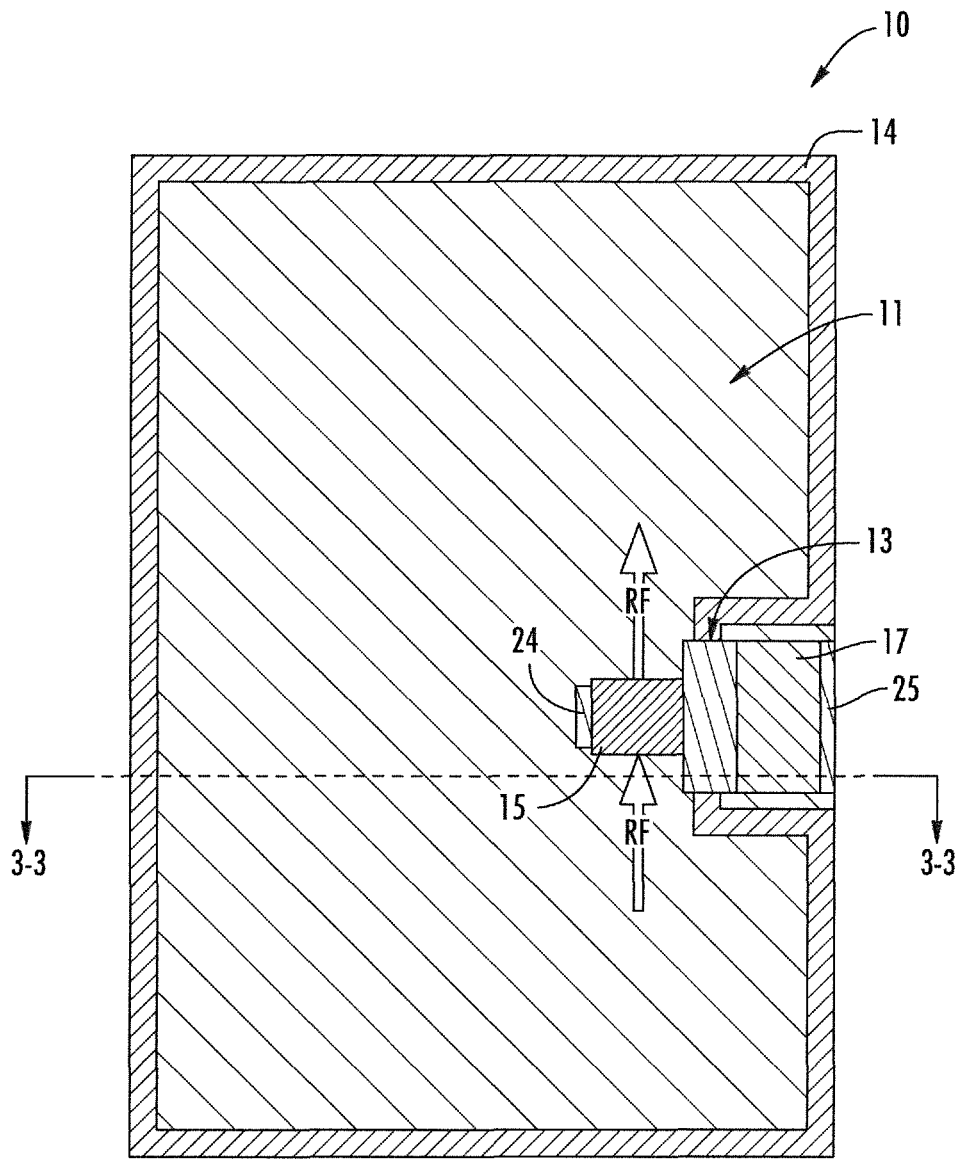
FIG. 4 is a schematic cross-sectional view of the electronic device of FIG. 3 along line 4-4 from FIG. 3.
Figure 5A:
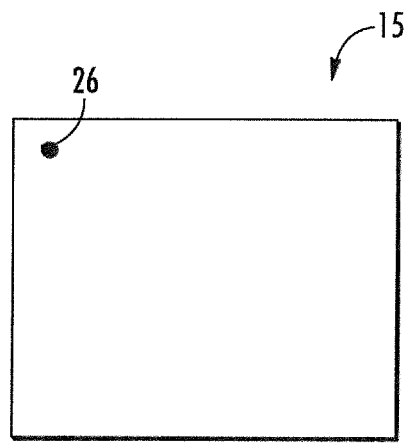
FIGS. 5A-5D are schematic top plan, schematic side elevational, schematic bottom plan, and schematic circuit views, respectively, of an example embodiment of the IC of the electronic device of FIG. 3.
Figure 5B:
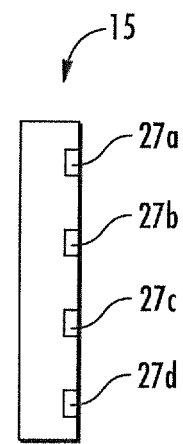
Figure 5C:
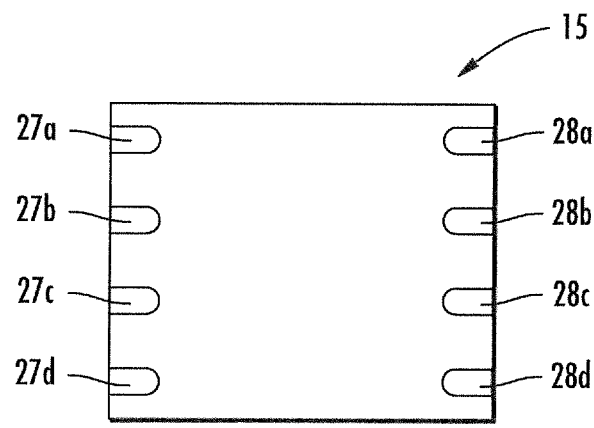
Figure 5D:
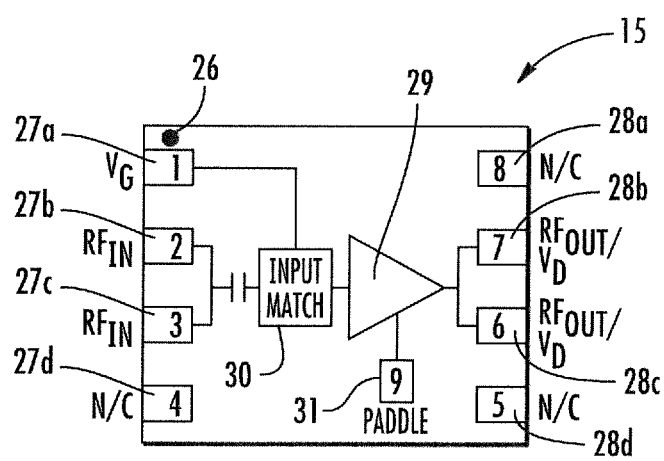

Referring now to FIGS. 3-4, an electronic device 10 according to the present disclosure is now described. The electronic device 10 illustratively includes a circuit board 11, an integrated circuit (IC) 15 carried by the circuit board, and a radio frequency (RF) shield 14 above the IC, in particular, fitted to cover and seal the IC beneath it. For example, the RF shield 14 may comprise an electrically conductive material, such as aluminum.

The circuit board 11 illustratively includes a dielectric layer 12, and a thermally conductive body 13 in the dielectric layer. The dielectric layer 12 may comprise a polymer or resin material, for example, a thermosetting resin laminate sheet or an organic polymer.

In some embodiments, the IC 15 may comprise an RF power amplifier that may generate significant waste thermal energy in operation. For example, the IC 15 may comprise a Gallium Nitride (GaN) power amplifier circuit with a plastic surface mount technology package. In these embodiments, it may helpful to transfer thermal energy through the bottom-side of the IC 15, i.e. topside thermal energy transfer is not possible. For example, the IC 15 may comprise a Macom NPA1006 GaN Wideband Power Amplifier, 28 V, 12.5 W, as available from MACOM Technology Solutions of Lowell, Mass. Of course, in other embodiments, the IC 15 may comprise different circuitry, generic circuitry, or other transmission chain circuitry.

More specifically, the circuit board 11 illustratively includes a top surface 21 adjacent the IC 15, and a bottom surface 22 opposite the top surface. In the illustrated embodiment, the electronic device 10 includes one or more additional ICs 20 carried by the bottom surface 22. Helpfully, this may provide for greater IC chip density in the package.

The thermally conductive body 13 may be coupled (i.e. electrically coupled) to an electrical reference voltage for the IC 15. For example, the electrical reference voltage may comprise a ground voltage reference.

The thermally conductive body 13 illustratively includes first and second opposing ends 24, 25. The first end 24 of the thermally conductive body 13 defines a first heat transfer surface 23a coupled (i.e. thermally coupled) to the IC 15. The second end 25 of the thermally conductive body 13 illustratively extends laterally within the dielectric layer 12 and outward past the RF shield 14 and defines a second heat transfer surface 23b. In the illustrated embodiment, the first and second heat transfer surfaces 23a-23b are be coplanar, but may be offset in other embodiments.

Figure 1:
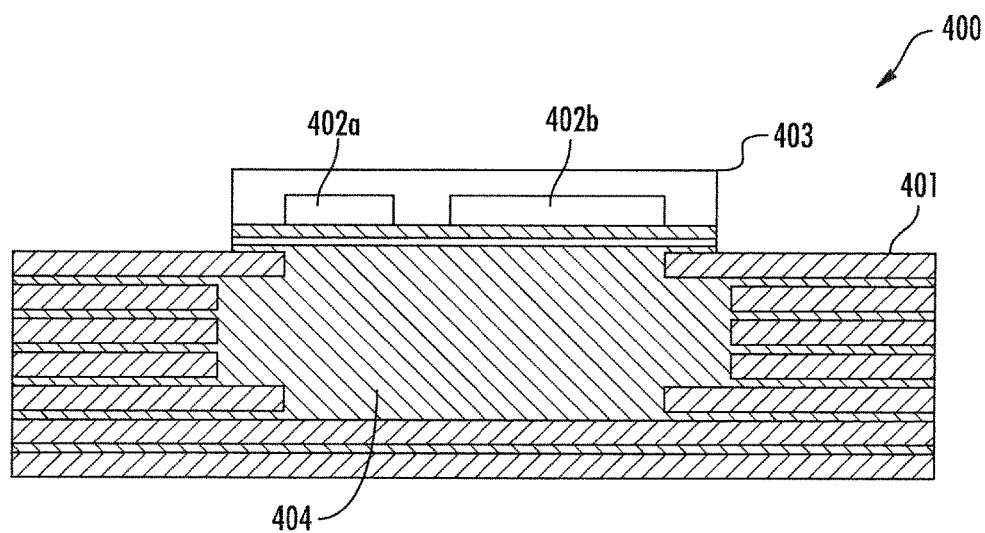
FIGS. 1-2 are schematic cross-sectional views of electronic devices, according to the prior art.
Figure 2:
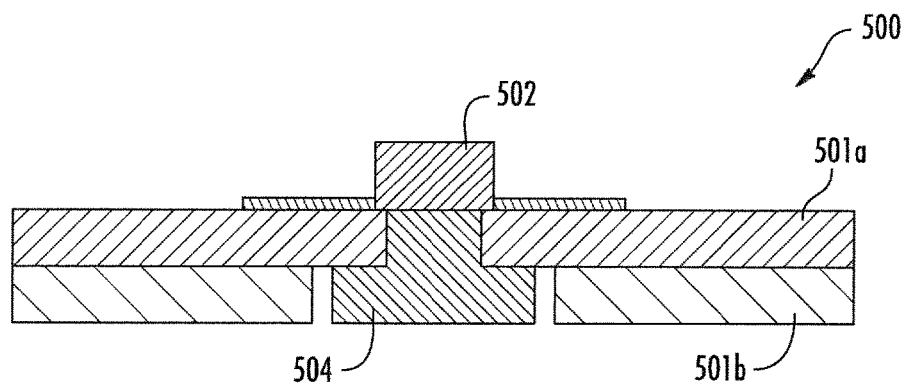

Also, the thermally conductive body 13 illustratively extends only partially through the dielectric layer 12 and is not exposed on the bottom surface 22. This is what allows for placement of the one or more additional ICs 20, in contrast to the typical approaches of FIGS. 1-2. For example, the thermally conductive body 13 may comprise one or more of copper, aluminum, copper alloys, aluminum alloys, composite materials (e.g. copper-tungsten pseudoalloy, silicon carbide in aluminum matrix (AlSiC), diamond in copper-silver alloy matrix (Dymalloy), and beryllium oxide in beryllium matrix (E-Material)).

In other embodiments, not shown, the circuit board 11 includes a plurality of blind vias extending from the top surface 21 and to the upper portion of the thermally conductive body 13. The plurality of blind vias may provide for enhanced mechanical coupling of the thermally conductive body 13 to the circuit board 11, and may also provide supplemental connections to the voltage reference defined by the thermally conductive body. In yet other embodiments, not shown, the circuit board 11 includes a plurality of gas relief passageways extending from the top or bottom surfaces 21-22.

The electronic device 10 illustratively includes a heat sink 16 coupled (i.e. thermally coupled) to the second heat transfer surface 23b. Additionally, the heat sink 16 illustratively includes a base 17 coupled (i.e. thermally coupled) to the second heat transfer surface 23b, and an arm 18 extending transversely to the base and over the RF shield 14, i.e. defining an L-shape heat sink. In some embodiments, the base 17 may comprise a thermal piston.

The electronic device 10 illustratively includes a thermal adhesive layer 19 between the second heat transfer surface 23b and the heat sink 16. The thermal adhesive layer 19 may comprise an epoxy resin, for example. In some embodiments, the electronic device 10 includes a thermal interface material between the IC 15 and the circuit board 11.

Referring now additionally to FIGS. 5A-5D, an exemplary embodiment of the IC 15 is now described. As will be appreciated by those skilled in the art, other circuit configurations may be used in other embodiments. The IC 15 illustratively includes a plurality of input-output pins 27a-28d, and an identifier pin 26 (i.e. providing orientation of connections) adjacent a corner on a top surface. The plurality of input-output pins 27a-28d comprises a gate voltage pin 27a, first and second $RF_{IN}$ pins 27b-27c, a paddle pin 31 (coupled to ground, i.e. the thermally conductive body 13), and first and second $RF_{OUT}$ pins 28b-28c. Pins 27a, 27d, 28a, 28d are not connected. The IC 15 illustratively includes an input impedance circuit 30 coupled to the first and second $RF_{IN}$ pins 27b-27c, and an amplifier circuit 29 coupled to the input impedance circuit. The amplifier circuit 29 illustratively includes an output coupled to the first and second $RF_{OUT}$ pins 28b-28c, and is also coupled to the paddle pin 31.

Advantageously, the electronic device 10 may transfer thermal energy upward and vertically away from the circuit board 11. This is in contrast to the prior art approaches disclosed in FIGS. 1-2, where the thermal energy is transferred vertically through the bottom and the circuit board. In some applications (e.g. GaN power amplifier embodiments with high chip density on both sides of the circuit board), this vertical thermal energy transfer is undesirable. The disclosed electronic device 10 provides an approach to this problem. Moreover, due to the feature that the thermally conductive body 13 only extends partially through the circuit board 11, the electronic device 10 can carry the one or more additional ICs 20 on the bottom surface 22.

Also, helpfully, the RF shield 14 completely encloses and isolates the IC 15, but the thermally conductive body 13 still permits effective thermal energy transfer in an upward direction. In short, the electronic device 10 provides a fully functional RF shield 14 with effective upward heat sinking. Yet further, the flanged peripheral edges 33 of the thermally conductive body 13 may allow for larger cross-section to move thermal energy horizontally, and also provide a solid mechanical interface with adjacent portions of the dielectric layer 12.

Another aspect is directed to a method for making an electronic device 10. The method may include positioning an IC 15 on a circuit board 11 and beneath a RF shield 14. The circuit board 11 may comprise a dielectric layer 12, and a thermally conductive body 13 in the dielectric layer. The thermally conductive body 13 has a first heat transfer surface 23*a* coupled to the IC 15. The thermally conductive body 13 may extend laterally within the dielectric layer 12 and outward past the RF shield 14 and define a second heat transfer surface 23*b*. The method may include coupling a heat sink 16 to the second heat transfer surface 23*b*.

Figure 6:
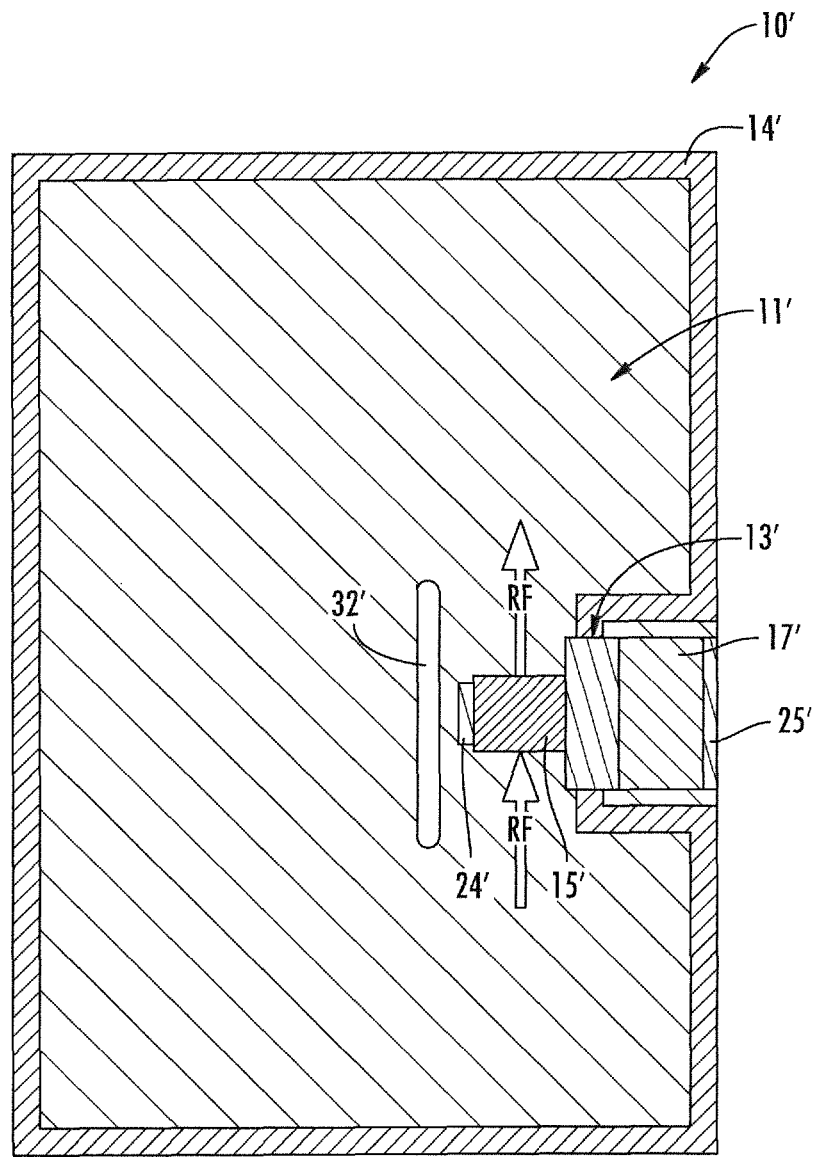
FIG. 6 is a schematic cross-sectional view of another embodiment of the electronic device of FIG. 3 along line 4-4.

Referring now additionally to FIG. 6, another embodiment of the electronic device 10' is now described. In this embodiment of the electronic device 10', those elements already discussed above with respect to FIGS. 3-5 are given prime notation and most require no further discussion herein. This embodiment differs from the previous embodiment in that this electronic device 10' has the circuit board 11' comprising a thermal dam 32' adjacent the IC 15'. The thermal dam 32' may comprise a routed slot with plated edges, and may thermally isolate the adjacent portions of the circuit board 11'.

Figure 7:
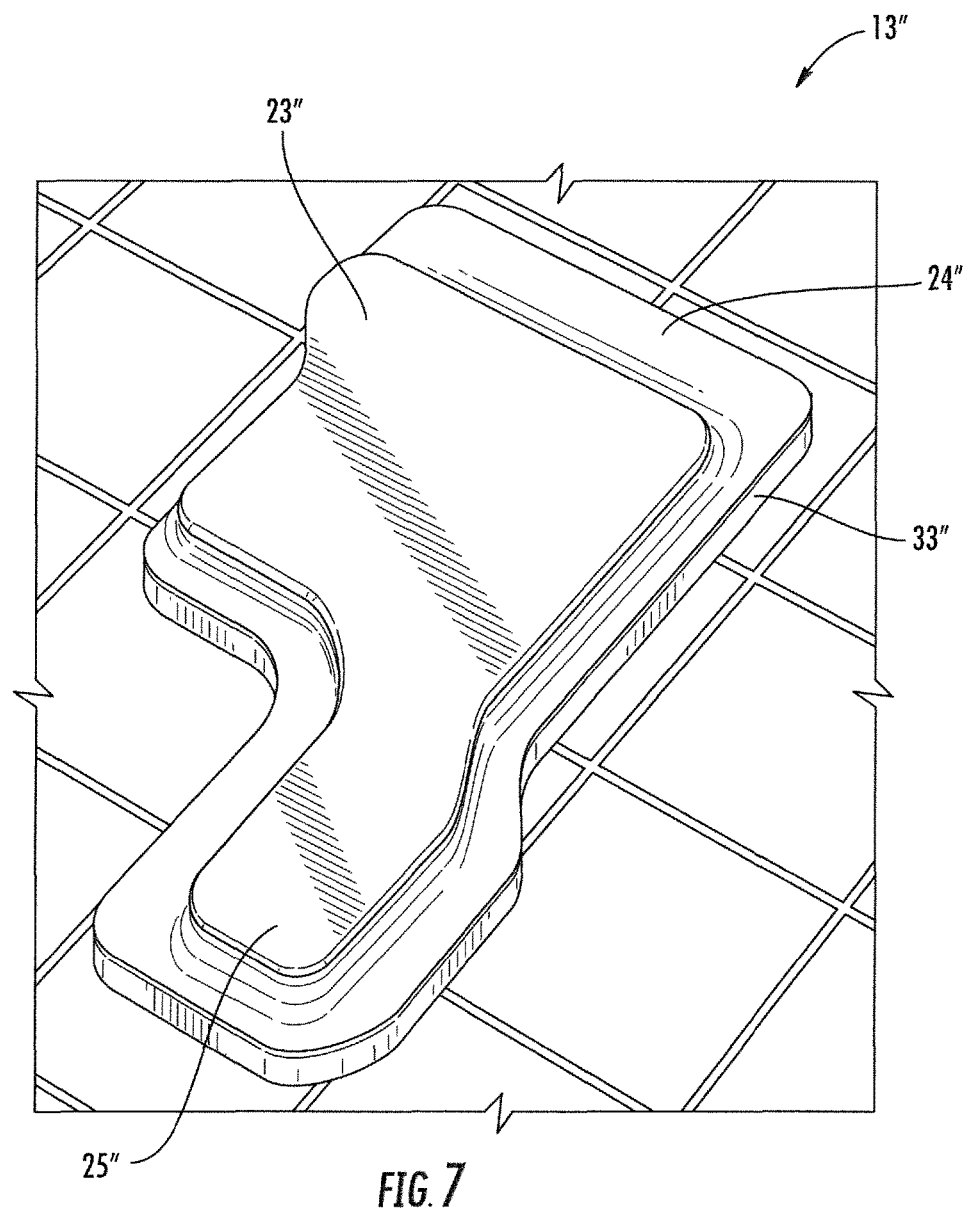
FIG. 7 is a perspective view of an example embodiment of the thermally conductive body from the electronic device, according to the present disclosure.

Referring now additionally to FIG. 7, another embodiment of the electronic device 10" is now described. In this embodiment of the electronic device 10", those elements already discussed above with respect to FIGS. 3-5 are given double prime notation and most require no further discussion herein. This embodiment differs from the previous embodiment in that this electronic device 10" has the thermally conductive body 13" illustratively including flanged peripheral edges 33". Also, in this embodiment, the thermally conductive body 13" illustratively has a "dog-leg" shape or medial bend therein. Of course, this shape is exemplary and other shapes and configurations are possible in other embodiments.

In this embodiment, the thermally conductive body 13" illustratively includes flanged peripheral edges 33" about the entirety of the perimeter. Of course, in other embodiments, the flanged peripheral edges 33" may extend only partially along the perimeter.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An electronic device comprising:
   a circuit board;
   an integrated circuit (IC) carried by said circuit board;
   a radio frequency (RF) shield above said IC;
   said circuit board comprising a dielectric layer, and a thermally conductive body in said dielectric layer, said thermally conductive body having a first heat transfer surface coupled to the IC;
   said thermally conductive body extending laterally within said dielectric layer and outward past said RF shield and defining a second heat transfer surface; and
   a heat sink coupled to said second heat transfer surface and separate from said RF shield.

2. The electronic device of claim 1 wherein said first and second heat transfer surfaces are coplanar.

3. The electronic device of claim 1 wherein said circuit board comprises a top surface adjacent said IC, and a bottom surface opposite the top surface; and further comprising an additional IC carried by said bottom surface.

4. The electronic device of claim 3 wherein said thermally conductive body extends only partially through the dielectric layer and is not exposed on the bottom surface.

5. The electronic device of claim 1 wherein said heat sink comprises a base adjacent said second heat transfer surface, and an arm extending transversely to said base and over said RF shield.

6. The electronic device of claim 1 wherein said thermally conductive body has flanged peripheral edges.

7. The electronic device of claim 1 wherein said thermally conductive body is coupled to an electrical reference voltage for said IC.

8. The electronic device of claim 1 wherein said thermally conductive body comprises copper.

9. The electronic device of claim 1 wherein said circuit board comprises a thermal dam adjacent said IC.

10. The electronic device of claim 1 further comprising a thermal adhesive layer between said second heat transfer surface and said heat sink.

11. A method for making an electronic device comprising:
    positioning an integrated circuit (IC) on a circuit board and beneath a radio frequency (RF) shield;
    the circuit board comprising a dielectric layer, and a thermally conductive body in the dielectric layer, the thermally conductive body having a first heat transfer surface coupled to the IC, and the thermally conductive body extending laterally within the dielectric layer and outward past the RF shield and defining a second heat transfer surface; and
    coupling a heat sink to the second heat transfer surface, the heat sink being separate from the RF shield.

12. The method of claim 11 wherein the first and second heat transfer surfaces are coplanar.

13. The method of claim 11 wherein the circuit board comprises a top surface adjacent the IC, and a bottom surface opposite the top surface; and further comprising an additional IC carried by the bottom surface.

14. The method of claim 13 wherein the thermally conductive body extends only partially through the dielectric layer and is not exposed on the bottom surface.

15. The method of claim 11 wherein the heat sink comprises a base adjacent the second heat transfer surface, and an arm extending transversely to the base and over the RF shield.

16. The method of claim 11 wherein the thermally conductive body has flanged peripheral edges.

* * * * *